United States Patent [19]
Overweg et al.

[11] Patent Number: 5,235,282
[45] Date of Patent: Aug. 10, 1993

[54] MAGNETIC RESONANCE APPARATUS COMPRISING A SUPERCONDUCTING SHIELDING MAGNET

[75] Inventors: Johannes A. Overweg; Gerardus N. Peeren, both of Eindhoven, Netherlands

[73] Assignee: U.S. Philips Corporation, New York, N.Y.

[21] Appl. No.: 800,200

[22] Filed: Nov. 27, 1991

[30] Foreign Application Priority Data

Nov. 30, 1990 [NL] Netherlands ............ 9002621

[51] Int. Cl.$^5$ ........................... G01R 33/20
[52] U.S. Cl. ........................... 324/318
[58] Field of Search ........... 324/300, 301, 309, 319, 324/320, 318; 335/216, 299; 361/141

[56] References Cited

U.S. PATENT DOCUMENTS

| | | | |
|---|---|---|---|
| 4,612,505 | 9/1986 | Zijlstra | 324/318 |
| 4,658,229 | 4/1987 | Chen et al. | 335/216 |
| 4,689,563 | 8/1987 | Bottomley et al. | 324/309 |
| 4,924,185 | 5/1990 | Matsutani | 324/319 |
| 4,931,735 | 6/1990 | Overweg et al. | 324/318 |
| 4,974,113 | 11/1990 | Gabrielse et al. | 361/141 |
| 4,990,878 | 2/1991 | Takechi et al. | 335/301 |

FOREIGN PATENT DOCUMENTS 0138270 5/1988 European Pat. Off.

OTHER PUBLICATIONS

Nuclear Magnetic Resonance "NMR" Imaging, W. B. Saunders Company, pp. 121–123.

*Primary Examiner*—Michael J. Tokar

[57] ABSTRACT

In a magnetic resonance apparatus comprising a superconducting magnet system (1) for generating a steady magnetic field there is also included a superconducting shielding coil system (22) in order to compensate for magnetic field variations induced in the magnet by external magnetic flux variations. The shielding coil system (22) comprises coil sections (24) of different diameters.

15 Claims, 1 Drawing Sheet

MAGNETIC RESONANCE APPARATUS COMPRISING A SUPERCONDUCTING SHIELDING MAGNET

FIELD OF THE INVENTION

The invention relates to a magnetic resonance apparatus, comprising a superconducting magnet coil system for generating a steady magnetic field in a measurement space within the magnet and also comprising a superconducting shielding coil system which is arranged so as to be coaxial with the steady field magnet coil system. Of interest is commonly owned copending U.S. application Ser. No. 797,847 entitled "Magnetic Resonance Apparatus" filed Nov. 26, 1991 in the name of Ham et al.

BACKGROUND OF THE INVENTION

A superconducting magnet coil system of this kind is known from EP 138 270. The cited publication discloses a magnet coil system which is composed of superconducting coils and which comprises, notably for active self-shielding, two coaxially arranged coil systems which are to be activated with opposite polarity.

In such magnet systems, actively shielded or not, internal magnetic field variations can be induced due to magnetic field variations occurring outside the magnet. Magnetic field disturbances within the magnet are liable to disturb the imaging by means of magnetic resonance signals.

The invention is inter alia based on the recognition of the fact that superconducting MR magnets are customarily used in the so-called persistent mode where the magnet is short-circuited in itself and, if the magnet coil circuit is suitably superconducting, current and field will remain very stable over a prolonged period of time. When a magnet thus short-circuited is exposed to a varying, externally generated magnetic field, for example originating from a moving magnetized object or resulting from a varying electric current, the total magnetic flux enclosed by the magnet will remain constant. When the external field causes a magnetic flux in the magnet, the current in the magnet will change so that the variation of the flux within the magnet will be equal but opposed to the external magnetic flux. Within the magnet a current variation causes a field variation whose extent is co-determined by a coil constant of the magnet. This field variation is generally opposed to the external field variation.

It is to be noted that U.S. Pat. No. 4,974,113 discloses a coil system which aims to reduce the effect of external field variations on the measurement field homogeneity, but this solution leads to a comparatively long coil system.

SUMMARY OF THE INVENTION

It is an object of the invention to reduce such magnetic field variations to such an extent that the imaging process is no longer disturbed. To achieve this, a magnetic resonance apparatus of the kind set forth in accordance with the invention is characterized in that the shielding coil system comprises coil sections of different diameters.

When a superconducting shielding coil system is provided, the composite magnet coil system is shielded against the magnetic field variations in that an adapted opposing field is generated in the shielding coil. The shielding coil system preferably forms a superconducting coil conductor circuit which is short-circuited in itself for persistent current conduction. Fully automatic shielding can thus be realized. The shielding coil system preferably comprises coils with arc conductor sections with two different diameters. In order to eliminate induced gradient field variations, it may be attractive to connect coils, for example symmetrically arranged with respect to the axial symmetry plane, so as to be activatable with opposite polarity.

In a preferred embodiment the magnet coil and the shielding magnet coils together constitute a magnet coil system incorporating substantially complete shielding against external magnetic field variations. External magnetic field variations cannot induce internal field variations in a magnet coil system of this kind.

A shielding coil system may be constructed as a solenoid which is short-circuited in itself, but it may also be constructed, for example as a stack of superconducting rings or as a single cylinder made of a superconducting material as described in U.S. Pat. No. 4,931,735. When used as a shielding magnet coil, a solenoid will become comparatively long with respect to the magnet coil when optimum shielding is to be achieved. A shorter shielding coil system can be realized in a preferred embodiment in that two series-connected, coaxially arranged coils of mutually different diameters are included.

A shielding factor which is strongly dependent on the geometry of the coil can be assigned to a magnet coil system. A superconducting MR magnet may consist of, for example six coaxial coil sections of the same diameter which have a geometry such that the field is uniform up to the 12th order and have a shielding factor of approximately 0.75, which value is dependent on, for example the width of the coil sections. This means that with the magnet the effect of an external field variation is reduced by induction to approximately one quarter of that outside the magnet.

The aforementioned class of magnets with active stray field compensation constitute a special case. The superconducting circuit then consists of coil sections having two different diameters, the coils of the greatest diameter having an opposed polarity. One requirement to be satisfied so as to achieve suitable stray field suppression of its own stray field is that the magnetic dipole moment must be substantially zero. The shielding factor, being proportional thereto, thus also becomes substantially zero. An actively shielded superconducting magnet, therefore, has no significant compensating effect as regards external field variations.

In order to reduce any reciprocal induction between coils of a magnet coil system in accordance with the invention, a preferred embodiment of the shielding coil system comprises three pairs of coil sections with two different diameters. Optimum shielding can thus be combined with, for example due to the configuration of the winding, a high degree of field homogeneity for the shielded magnet system.

The shielding coil system is preferably coaxial and mirror-symmetrical with respect to an axial central plane and comprises coil sections of mutually the same polarity with diameters adapted to coil sections of the magnet coil system. Thus, shielding coil systems can be realized which can be mounted in a common Dewar vessel, preferably on supports for coil sections of the steady magnet coil system, their length in any case not being substantially greater than that of the main magnet.

Using, for example an axially most inwards situated shielding coil pair, the shielding and the field homogeneity can be optimized. From a constructional point of view, actively shielded magnet systems make the use of shielding coil sections of mutually different diameter comparatively simple by adaptation of diameters to inner or outer diameters of the two coil systems thereof.

In a preferred embodiment superconducting switches are included in the shielding coil circuit in order to prevent high current intensities in shielding coils, for example due to quenching or upon activation of the magnet and so on.

BRIEF DESCRIPTION OF THE DRAWING

Some preferred embodiments in accordance with the invention will be described in detail hereinafter with reference to the drawing. Therein.

DESCRIPTION OF THE PREFERRED EMBODIMENT

Figure 1:
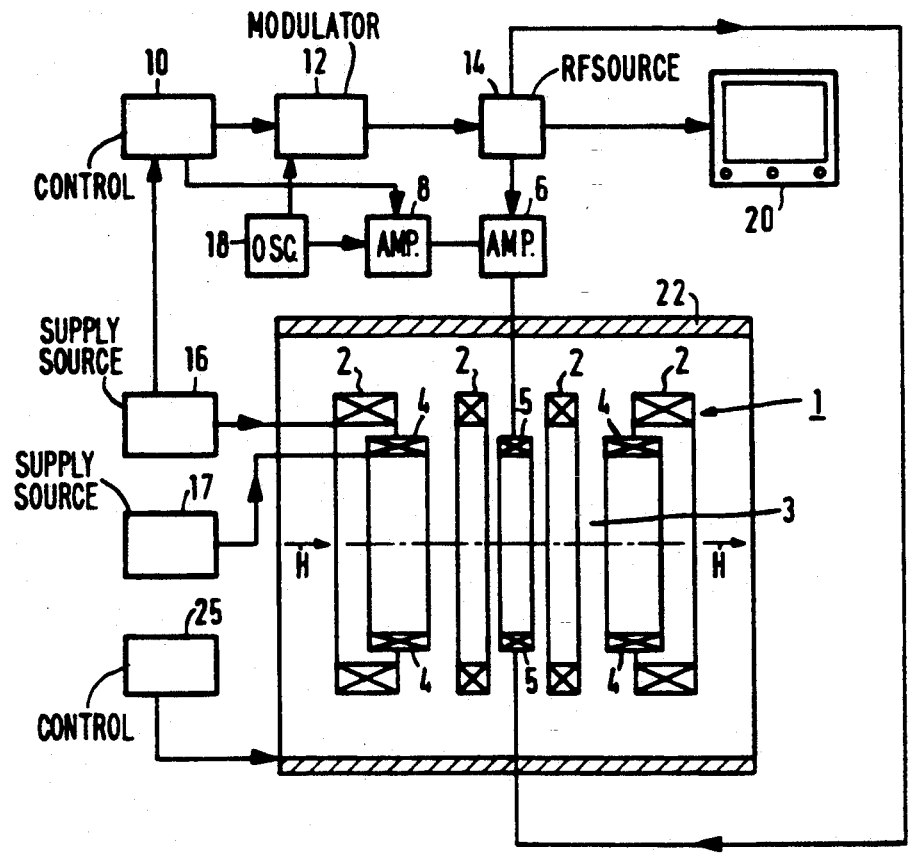
FIG. 1 diagrammatically shows a magnetic resonance apparatus in accordance with the invention.

A magnetic resonance apparatus as shown in FIG. 1 comprises a steady field magnet with an electromagnetic coil system 1 which comprises, for example from four to eight coils 2 for generating a strong, steady, uniform magnetic field in a measurement space 3 within the coil system. For various feasible coil systems reference is made to MR imaging, pp. 121-123. For the use as a magnetic resonance tomography apparatus, i.e. an apparatus for the slice-wise imaging of an object, to be described hereinafter use is made of gradient coils 4. In magnetic resonance spectrometry apparatus, i.e. apparatus for the detection of various spin types of elements or molecules in an object, the gradient coils can be dispensed with.

Furthermore, RF coils 5 are arranged comparatively closely around the measurement space, which RF coils serve as transmitter coils for an RF electromagnetic field and as a detection coil for spin resonance signals thus generated. It is alternatively possible to use separate coils for these two functions. Spin resonance signals stimulated by the RF electromagnetic field in an object to be measured are picked up via a signal amplifier 6 and applied, via a phase-sensitive amplifier 8, to a central arithmetic and control device 10. Also shown are a modulator 12 for an RF supply source 14, a supply source 16 for the main field magnet coils, a supply source 17 for the gradient coils, an RF oscillator 18, and a monitor 20 for image display. The oscillator 18 controls the modulator 12 for the RF fields as well as the phase-sensitive amplifier 8 which processes the measurement signals.

Figure 2:
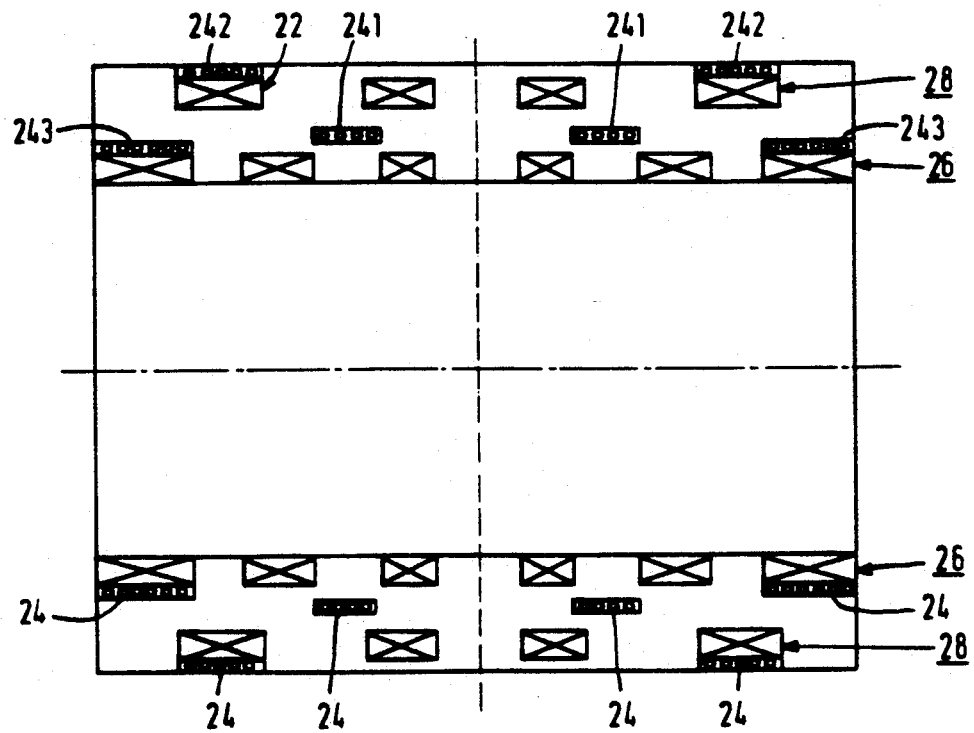
FIG. 2 shows an embodiment of a coil system for such an apparatus.

In accordance with the invention, a shielding coil system 22 with a control device 25 is arranged concentrically around or in the steady field magnet coil system. In a preferred embodiment, the shielding coil system, in this case being adapted to a steady field magnet system with active shielding for its own stray field, comprises three pairs of coil sections 24, FIG. 2, an inner pair 241 and an outer pair 243, viewed in the axial direction, of which are mounted on a coil former for a first magnet coil system 26 of the main magnet 1, a central pair 242 being arranged on a coil former for a second magnet coil system 28 of the main magnet 1. The shielding and the field homogeneity can be optimized preferably by way of the axial length and the winding configuration of the coil pair 241. The shielding system may comprise axially offset coil systems for activation with opposite polarity.

It has already been stated that many coil configurations are feasible which satisfy the requirements imposed. A simple solution consists in simple solenoid coils having a finite length with a uniform number of turns per unit of length. Calculations demonstrate that as a function of the length-to-diameter ratio of the solenoid the shielding factor 1 of this type of coil is achieved for a length-to-diameter ratio of 1.75. When the coil is longer, an external field variation is overcompensated, whereas a shorter coil offers inadequate compensation for an external field.

A length-to-diameter ratio of 0.875 is unpractical for a practical MR magnet. In the embodiment described with reference to FIG. 2 a substantially shorter coil system having the shielding factor 1 is obtained by utilizing two coaxial coils of different diameters, which coils together constitute a closed superconducting circuit. It is desirable to design the shielding coil system so that a high field homogeneity is achieved within the coil. Such a high homogeneity is desirable because, in the event of poor homogeneity, the shielding factor outside the isocenter will not be equal to that in the isocenter; this difference may not become excessively large. Furthermore, if a net inductive coupling exists between the superconducting magnet and the superconducting shielding coil, field drift of the magnet, caused by its residual resistance, will induce a current in the shielding coil which may become much greater than the current variations induced due to external interference fields; the field of this drift-induced current may not have an adverse effect on the homogeneity of the magnet system. When reciprocal induction occurs between a shielding coil and the magnet coil, the variation in the coil current induced due to the inductive coupling must also be taken into account in the calculation of the shielding coil configuration. In order to prevent large currents in the secondary system in the case of quenching of a primary coil, it is desirable that the reciprocal induction is then approximately zero.

Because the current intensity through current windings of the shielding coil system is comparatively low, it is usually possible to utilize superconductors having a comparatively low $I_c$, for example single current conductors composed of a single superconducting core wire and a non-superconducting sheath.

We claim:

1. A magnetic resonance apparatus, comprising a superconducting steady field magnet coil system including a magnet for generating a magnetic field in a measurement space within the magnet and a superconducting shielding coil system which is arranged so as to be coaxial with the steady field magnet coil system, said shielding coil system comprising coil sections of different diameters.

2. A magnetic resonance apparatus as claimed in claim 1, wherein the shielding coil system comprises a superconducting solenoid.

3. A magnetic resonance apparatus as claimed in claim 1, wherein the shielding coil system comprises three series-connected coaxially mounted coil pairs having two mutually different diameters.

4. A magnetic resonance apparatus as claimed in claim 1 wherein, the shielding coil system is composed of coil pair sections mounted on formers for magnet coils of the steady field magnet.

5. A magnetic resonance apparatus as claimed in claim 4, wherein the steady field magnet coil system is constructed so as to shield its own stray field, magnet coil sections of the shielding coil system being mounted on formers of the steady field magnet coils as well as of the stray field shielding coils.

6. A magnetic resonance apparatus as claimed in claim 1 wherein the shielding coil system comprises two coil systems which are axially offset with respect to one another for activation with opposite polarity.

7. A magnetic resonance apparatus as claimed in claim 1 wherein the sections of the shielding coil system are wound using a single superconducting wire provided with a non-superconducting sheath.

8. A superconducting magnet system for generating a steady magnetic field, comprising magnet coils of a first coil system and a superconducting shielding coil system comprising magnet coils coaxial with the magnet coils of the first system, the magnet coils of the shielding system being different in diameter in order to compensate for magnetic field variations included in the magnet system due to external magnetic flux variations.

9. A magnetic resonance apparatus as claimed in claim 2 wherein the shielding coil system comprises three series-connected coaxially mounted coil pairs having two mutually different diameters.

10. A magnetic resonance apparatus as claimed in claim 3 wherein the shielding coil system is composed of coil pair sections mounted on formers for magnet coils of the steady field magnet.

11. A magnetic resonance apparatus as claimed in claim 5 wherein the shielding coil system comprises two coil systems which are axially offset with respect to one another for activation with opposite polarity.

12. A magnetic resonance apparatus as claimed in claim 10 wherein the shielding coil system comprises two coil systems which are axially offset with respect to one another for activation with opposite polarity.

13. A magnetic resonance apparatus as claimed in claim 5 wherein the coil sections of the shielding coil system are wound using a single superconducting wire providing with a non-superconducting sheath.

14. A magnetic resonance apparatus as claimed in claim 11 wherein the coil sections of the shielding coil system are wound using a single superconducting wire providing with a non-superconducting sheath.

15. A magnetic resonance apparatus as claimed in claim 9 wherein the shielding coil system comprises two coil systems which are axially offset with respect to one another for activation with opposite polarity.

* * * * *